US008147617B2

(12) United States Patent
Sekiguchi et al.

(10) Patent No.: US 8,147,617 B2
(45) Date of Patent: Apr. 3, 2012

(54) SUBSTRATE CLEANING METHOD AND COMPUTER READABLE STORAGE MEDIUM

(75) Inventors: Kenji Sekiguchi, Nirasaki (JP); Hiroki Ohno, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 605 days.

(21) Appl. No.: 11/628,308

(22) PCT Filed: Jun. 1, 2005

(86) PCT No.: PCT/JP2005/010034
§ 371 (c)(1),
(2), (4) Date: Dec. 1, 2006

(87) PCT Pub. No.: WO2005/119748
PCT Pub. Date: Dec. 15, 2005

(65) Prior Publication Data
US 2008/0041420 A1    Feb. 21, 2008

(30) Foreign Application Priority Data
Jun. 4, 2004   (JP) .................................. 2004-167246

(51) Int. Cl.
*B08B 7/00*        (2006.01)
*B08B 7/04*        (2006.01)
(52) U.S. Cl. ................ 134/30; 134/26; 134/33; 134/34; 134/36; 134/37; 134/18; 134/902
(58) Field of Classification Search .................... 134/18, 134/33, 26, 30, 32, 34, 37, 36, 902
See application file for complete search history.

(56) References Cited

U.S. PATENT DOCUMENTS

| 5,997,653 | A | * | 12/1999 | Yamasaka .......................... 134/2 |
| 6,260,562 | B1 | * | 7/2001 | Morinishi et al. ........... 134/57 R |
| 6,705,331 | B2 | * | 3/2004 | Sato et al. ..................... 134/99.1 |
| 6,730,176 | B2 | * | 5/2004 | Kuyel ............................... 134/1 |
| 6,951,221 | B2 | * | 10/2005 | Okuda et al. ................. 134/56 R |
| 2002/0001781 | A1 | | 1/2002 | Ema et al. |
| 2002/0053355 | A1 | | 5/2002 | Kamikawa et al. |
| 2003/0034048 | A1 | | 2/2003 | Hagimoto et al. |
| 2003/0051742 | A1 | * | 3/2003 | Boyers ............................. 134/30 |
| 2003/0079764 | A1 | * | 5/2003 | Hirose et al. ................. 134/95.3 |
| 2003/0104703 | A1 | | 6/2003 | Yang et al. |

(Continued)

FOREIGN PATENT DOCUMENTS
JP       54-125981       *    9/1979
(Continued)

OTHER PUBLICATIONS
Abstract of JP 10-172951, Jun. 26, 1998.*
(Continued)

*Primary Examiner* — Alexander Markoff
(74) *Attorney, Agent, or Firm* — Smith, Gambrell & Russell, LLP

(57) ABSTRACT

A wafer W is processed by supplying a two-fluid, high pressure jet water, or mega-sonic water onto the wafer W, while rotating the wafer W in an essentially horizontal state. After supply of the cleaning fluid is stopped, the wafer W is dried by rotating the wafer W at a higher speed than that used in supplying the cleaning fluid. No rinsing process using purified water is performed in a period after stopping supply of the cleaning fluid and before rotating the substrate at the higher speed.

8 Claims, 10 Drawing Sheets

U.S. PATENT DOCUMENTS

2004/0074526 A1* 4/2004 Aoki et al. ................ 134/36

FOREIGN PATENT DOCUMENTS

| | | | |
|---|---|---|---|
| JP | 56-27931 | | 3/1981 |
| JP | 8-148459 | | 6/1996 |
| JP | 10-172951 | * | 6/1998 |
| JP | 11-102854 | | 4/1999 |
| JP | 2002-25963 | | 1/2002 |
| JP | 2002-45800 | | 2/2002 |
| JP | 2003-59883 | | 2/2003 |
| JP | 2003-168670 | | 6/2003 |
| JP | 2003-203892 | | 7/2003 |
| JP | 2003-243349 | | 8/2003 |
| JP | 2004-146439 | | 5/2004 |
| JP | 2004-146594 | | 5/2004 |

OTHER PUBLICATIONS

Japanese Office Action issued on Mar. 31, 2009 for Japanese Patent Application No. 2006-514111 with English translation.

Search Report received in EP 05745784.8 mailed Jan. 27, 2010.

* cited by examiner

SUBSTRATE CLEANING METHOD AND COMPUTER READABLE STORAGE MEDIUM

TECHNICAL FIELD

The present invention relates to a substrate cleaning method for suppressing static build-up on a substrate, such as a semiconductor wafer, and a computer readable storage medium for controlling a substrate cleaning apparatus to conduct this substrate cleaning method.

BACKGROUND ART

For example, in the process of manufacturing semiconductor devices, a cleaning process is performed on a semiconductor wafer, as needed, to keep the surface of the semiconductor wafer clean. Jpn. Pat. Appln. KOKAI Publication No. 2003-168670 discloses a cleaning process of the single-wafer type, in which semiconductor wafers are processed one by one, as follows. Specifically, purified water is changed into mist by an inactive gas to obtain a fluid (i.e., a fluid of a so-called two-fluid type). The fluid thus obtained is supplied onto the surface of a semiconductor wafer, while the semiconductor wafer is rotated, to remove particles and so forth from the surface. Then, purified water is supplied onto the semiconductor wafer to perform a rinsing process thereon. Then, the semiconductor wafer is subjected to spin-drying.

However, this cleaning method increases the absolute value of static build-up voltage generated on the cleaned semiconductor wafer. Due to this voltage, the semiconductor wafer itself may be broken, or circuits formed on the surface of the semiconductor wafer may be damaged.

DISCLOSURE OF INVENTION

An object of the present invention is to provide a substrate cleaning method that can suppress static build-up on a substrate, such as a semiconductor wafer. Another object of the present invention is to provide a computer readable storage medium used for an apparatus to conduct this substrate cleaning method.

In the process of developing the present invention, the inventor made an assiduous study as to when static build-up was caused on semiconductor wafers in cleaning processes. As a result, the inventor has arrived at findings such that the static build-up level is most greatly influenced by the processing time of a rinsing process step and the rotation number of the semiconductor wafer used at this time.

According to a first aspect of the present invention, there is provided a substrate cleaning method comprising: supplying a two-fluid, high pressure jet water, or mega-sonic water onto a substrate, while rotating the substrate in an essentially horizontal state, thereby processing the substrate; and then rotating the substrate at a higher speed than that used in supplying the two-fluid, high pressure jet water, or mega-sonic water, thereby drying the substrate, after stopping supply of the two-fluid, high pressure jet water, or mega-sonic water, wherein the method comprises no rinsing process using purified water in a period after stopping supply of the two-fluid, high pressure jet water, or mega-sonic water and before rotating the substrate at the higher speed.

The substrate cleaning method according to the first aspect does not include a rinsing process step, which is conventionally considered as being indispensable. Conventionally, it is commonly thought by persons skilled in the art that a process using a two-fluid, or alternatively using high pressure jet water or mega-sonic cleaning water (these fluids will be collectively referred to as "cleaning fluid", hereinafter) should be followed by a rinsing process using purified water. One of the reasons for this resides in that a rinsing process is indispensable in brush-scrub cleaning, which was in the mainstream before processes using the cleaning fluid described above have been adopted. Even though process modes have been changed from brush cleaning to non-brush cleaning, persons skilled in the art still follow the process steps of brush-scrub cleaning, without considering omission of the rinsing process. Further, it is commonly thought by persons skilled in the art that, where a rinsing process using purified water is performed, particles and so forth contained in a purified water film on the substrate are removed, so the cleaning accuracy is improved.

However, according to the inventor's study in detail on cleaning process steps using the cleaning fluid described above, the following matter has been confirmed. Specifically, since a process using such a cleaning fluid itself comprises a purified water process, a rinsing process using purified water performed thereafter cannot improve the accuracy in removing particles and so forth.

On the other hand, it has been confirmed that a rinsing process performed thereafter brings about an ill effect such that static build-up is developed on the substrate. Further, a rinsing process performed thereafter brings about another ill effect such that the entire processing time of the substrate cleaning process becomes longer, so the throughput of the cleaning apparatus is deteriorated. The invention according to the first aspect solves these problems. Specifically, the static build-up is suppressed, and the throughput is improved.

Further, the conditions of processes using such a cleaning fluid were reviewed on the basis of the finding described above, and it has been found that the absolute value of static build-up voltage generated in these processes using the cleaning fluid is greatly influenced by the scanning speed of the cleaning fluid supply nozzle and the substrate rotation number. Accordingly, in order to further suppress the static build-up, the substrate cleaning method according to the first aspect may be arranged, as follows. Specifically, the method comprises rotating the substrate at a rotation number preferably of 100 to 900 rpm, and more preferably of 300 to 600 rpm, while supplying the cleaning fluid. The method preferably comprises causing a supply point of the cleaning fluid onto the substrate to travel in a radial direction of the substrate, while setting a traveling speed of the supply point of the cleaning fluid to be higher at a central portion of the substrate than at a peripheral portion thereof, so as to equalize a processing time per unit area over the substrate. Alternatively, the method may comprise causing a supply point of the cleaning fluid onto the substrate to travel in a radial direction of the substrate at a constant speed, while setting a rotation number of the substrate to be higher for the supply point being present at a central portion of the substrate than at a peripheral portion thereof, so as to equalize a processing time per unit area over the substrate.

According to a second aspect of the present invention, there is provided a substrate cleaning method comprising:

processing a substrate by use of a predetermined cleaning liquid;

supplying purified water onto the substrate, while rotating the substrate in an essentially horizontal state, thereby performing a rinsing process; and rotating the substrate at a higher-speed than that used in supplying the rinsing process, thereby drying the substrate, wherein the method comprises causing a supply point of the purified water onto the substrate to travel in a radial direction of the substrate in performing the rinsing process.

As described above, it has become apparent that the static build-up on the substrate is greatly influenced by the rinsing process step. However, where a cleaning process using an alkaline chemical liquid or acid chemical liquid is performed or a scrub cleaning process is performed, a rinsing process needs to be performed thereafter to wash away the chemical liquid and so forth. In this case, it is preferable to suppress the static build-up on the substrate as far as possible.

Conventionally, the rinsing process is performed while supplying purified water onto the center of the substrate being rotated. However, the inventor has found that, in this case, the absolute value of static build-up voltage becomes larger at the central portion of the substrate. In the substrate cleaning method according to the second aspect, the purified water supply point is caused to travel in a radial direction, as described above. Consequently, it is possible to prevent the absolute value of static build-up voltage from being locally increased on the substrate, and to suppress the static build-up to be smaller and more uniform over the entire substrate.

In order to enhance the effect described above, the method preferably comprises setting a traveling speed of the supply point of the purified water to be higher at a peripheral portion of the substrate than at a central portion thereof in performing the rinsing process, so as to equalize a processing time per unit area over the substrate. Alternatively, the method preferably comprises setting a rotation number of the substrate to be higher for the supply point of the purified water being present at a central portion of the substrate than at a peripheral portion thereof. The method preferably comprises rotating the substrate at a rotation number of 100 to 900 rpm, while supplying the purified water at a flow rate of 0.3 to 1.5 L/min, in performing the rinsing process. The purified water used in performing the rinsing process preferably contains carbon dioxide gas dissolved therein, by which the absolute value of static build-up voltage is further decreased.

Furthermore, the present invention provides a computer readable storage medium for a cleaning apparatus to conduct the cleaning method described above.

Specifically, according to a third aspect of the present invention, there is provided a computer readable storage medium that stores a software for a computer to execute a control program, wherein the control program, when executed, controls a cleaning apparatus to perform a substrate cleaning method comprising: (a) supplying a two-fluid, high pressure jet water, or mega-sonic water onto a substrate, while rotating the substrate in an essentially horizontal state, thereby processing the substrate; and then (b) rotating the substrate at a higher speed than that used in supplying the two-fluid, high pressure jet water, or mega-sonic water, thereby drying the substrate, after stopping supply of the two-fluid, high pressure jet water, or mega-sonic water, wherein the method comprises no rinsing process using purified water in a period after stopping supply of the two-fluid, high pressure jet water, or mega-sonic water and before rotating the substrate at the higher speed.

According to a fourth aspect of the present invention, there is provided a computer readable storage medium that stores a software for a computer to execute a control program, wherein the control program, when executed, controls a cleaning apparatus to perform a substrate cleaning method comprising: (a) processing a substrate by use of a predetermined cleaning liquid; (b) supplying purified water onto the substrate, while causing a supply point of the purified water onto the substrate to travel in a radial direction of the substrate and rotating the substrate in an essentially horizontal state, thereby performing a rinsing process; and (c) rotating the substrate at a higher speed than that used in supplying the rinsing process, thereby drying the substrate.

According to the present invention described above, since the static build-up on a substrate is suppressed, it is possible to prevent the substrate from being broken and to protect circuits and so forth formed on the surface of the substrate. Further, where no rinsing process is performed, the throughput of the cleaning apparatus is advantageously improved.

BEST MODE FOR CARRYING OUT THE INVENTION

Embodiments of the present invention will now be described with reference to the accompanying drawings, while taking a semiconductor wafer cleaning method as an example.

Figure 1:
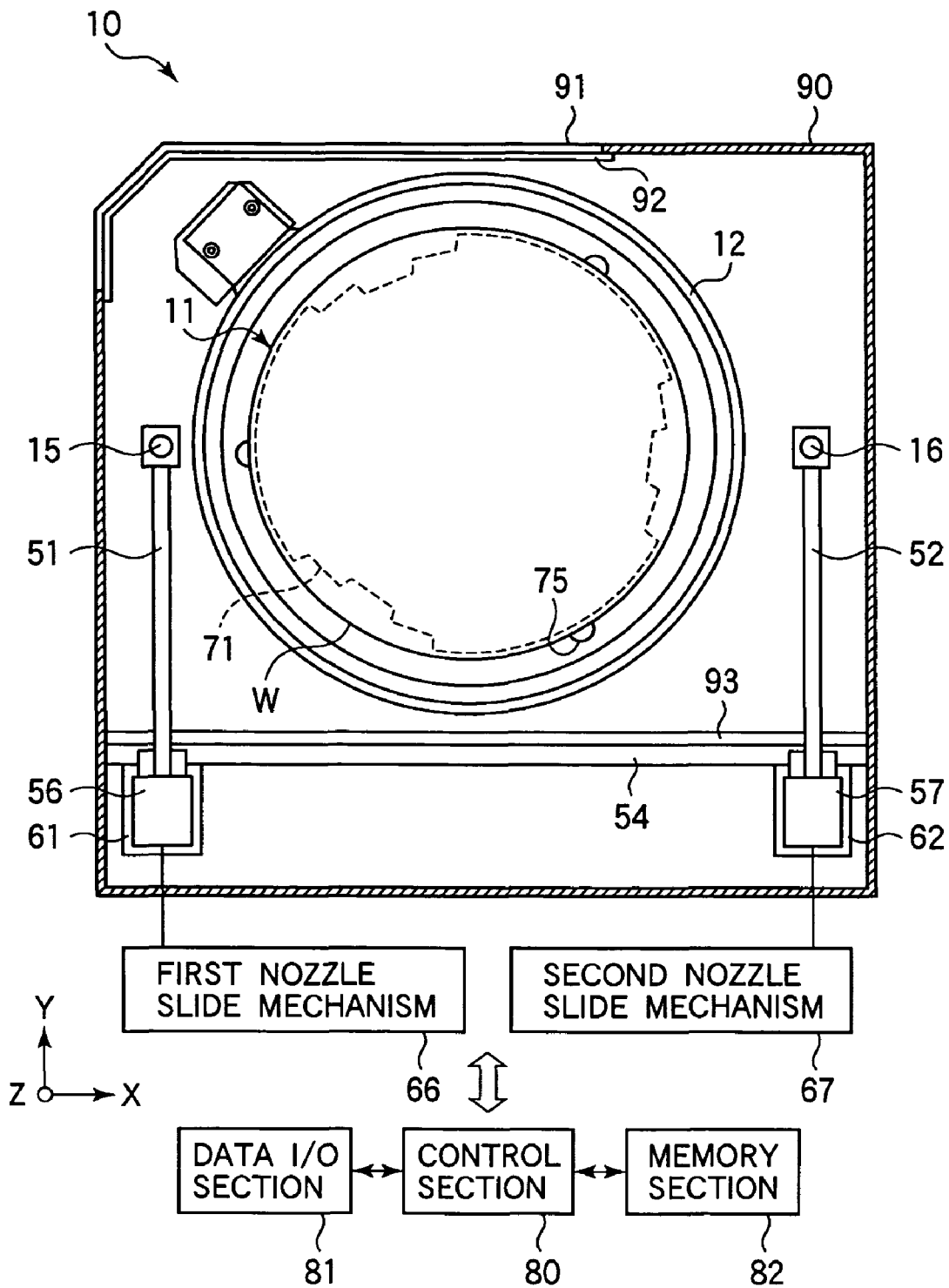
[FIG. 1] This is a plan view schematically showing the structure of a cleaning apparatus.
Figure 2:
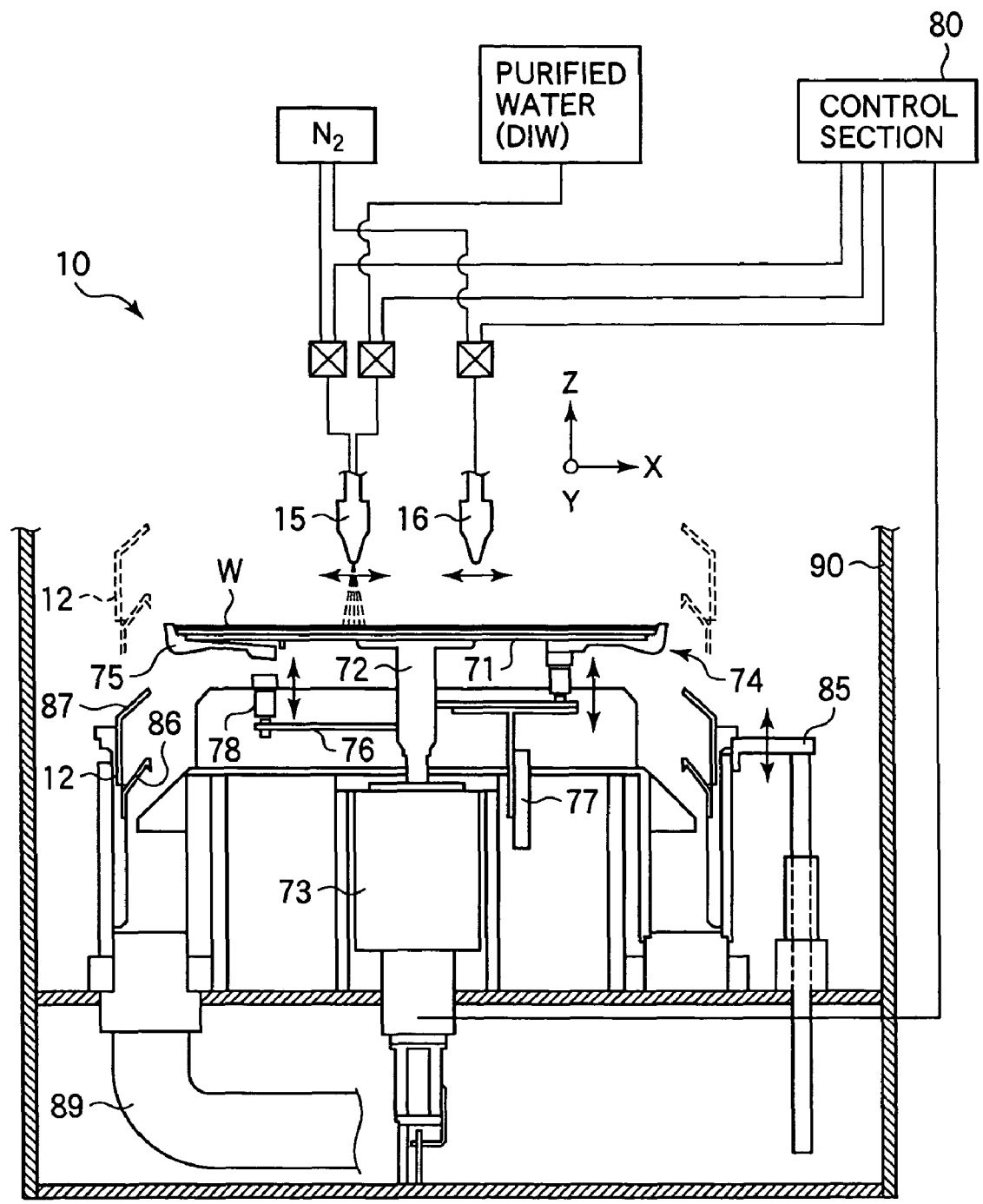
[FIG. 2] This is a Z-X sectional view of the cleaning apparatus shown in FIG. 1.
Figure 3:
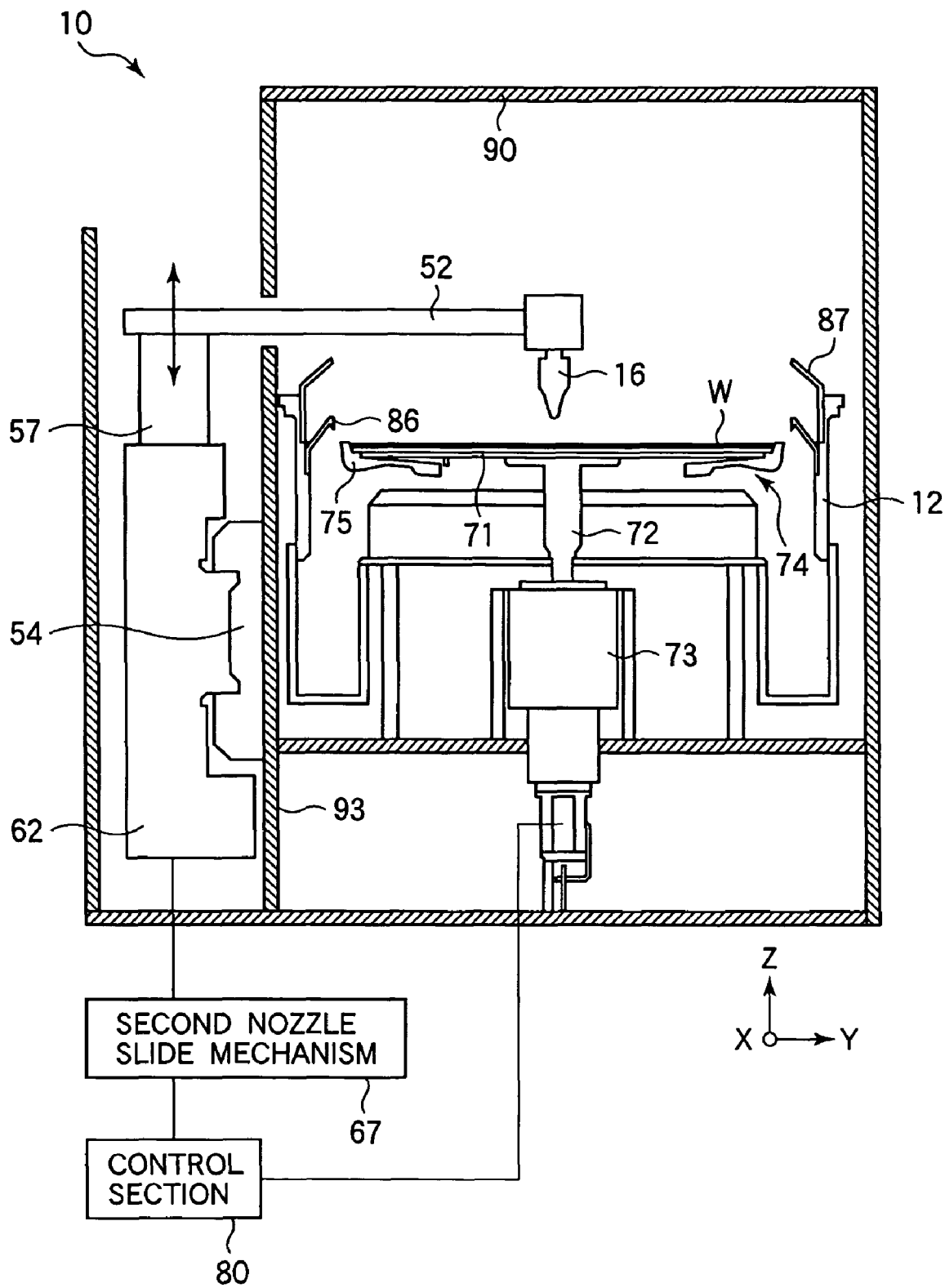
[FIG. 3] This is a Y-Z sectional view of the cleaning apparatus shown in FIG. 1.

FIG. 1 is a plan view schematically showing the structure of a cleaning apparatus 10. FIG. 2 is a Z-X sectional view of the cleaning apparatus 10. FIG. 3 is a Y-Z sectional view of the cleaning apparatus 10. In this respect, the X-direction and Y-direction are perpendicular to each other in the horizontal plane, and the Z-direction is the vertical direction.

The cleaning apparatus 10 includes a housing 90, in which respective components are disposed. The housing 90 has a window portion 91 formed in one side and provided with a shutter 92 capable of opening/closing the window portion 91. The window portion 91 is used for loading and unloading a wafer W therethrough. The interior of the housing 90 is divided by a partition wall 93 into two chambers. As described later, one of the chambers is a liquid process chamber in which cleaning liquid and/or purified water are used. The other chamber is a mechanism accommodation chamber in which driving mechanisms for moving various nozzles used in a cleaning process are disposed.

In the housing 90, a spin chuck 11 is disposed to hold a wafer W in an essentially horizontal state, and a cup 12 is disposed to surround the wafer W held by the spin chuck 11. Further, in the housing 90, a cleaning liquid nozzle 15 is disposed to supply a cleaning liquid onto the surface of the wafer W, and a gas nozzle 16 is disposed to supply an inactive gas, such as nitrogen gas, onto the surface of the wafer W.

The spin chuck 11 includes a chuck plate 71, a rotary shaft 72 supporting the chuck plate 71, and a motor 73 for rotating the rotary shaft 72. The spin chuck 11 is provided with an attaching mechanism 74 for holding/releasing the wafer W placed on the chuck plate 71. Further, the chuck plate 71 is provided with support pins (not shown) disposed on the surface to support the wafer W thereon.

The attaching mechanism 74 includes holding members 75 disposed at three positions on the periphery of the chuck plate 71. The attaching mechanism 74 further includes a plate member 76 disposed below the chuck plate 7, and an elevating mechanism 77 for moving the plate member 76 up and down. Pushing jigs 78 are mounted on the plate member 76 at positions corresponding to the holding members 75. The left side of FIG. 2 shows a state where the holding members 75 hold the wafer W. The right side of FIG. 2 shows a state where the holding members 75 do not hold the wafer W.

The attaching mechanism 74 is operated such that a state for holding the wafer W and a state for releasing the wafer W are switched by the holding members 75 being moved by a leverage. Specifically, when the elevating mechanism 77 is operated upward, the pushing jigs 78 disposed at three positions respectively push the inner peripheral ends of the holding members 75 toward the bottom of the chuck plate 71. Consequently, the outer peripheral ends of the holding members 75 are moved outward and downward, thereby canceling the state for holding the wafer W. On the other hand, when the elevating mechanism 77 is operated downward, the pushing jigs 78 are respectively separated from the holding members 75. Consequently, the outer peripheral ends of the holding members 75 are moved inward and upward, and brought into contact with the edge of the wafer W. At this time, the holding members 75 apply a force onto the wafer W from the edge thereof toward the center, thereby holding the wafer W.

The cup 12 is arranged to be moved up and down by an elevating mechanism 85. FIG. 2 shows both of a lower position (denoted by a solid line) and an upper position (denoted by a dotted line), while FIG. 3 shows only the upper position. When the wafer W is loaded or unloaded, the cup 12 is set in the lower position. When a cleaning process is performed, the cup 12 is set in the upper position. The cup 12 has tapered portions 86 and 87 disposed at upper and lower positions each inclined such that the inner periphery is higher than the outer periphery. The cup 12 has a gas exhaust duct 89 disposed at the bottom.

The cleaning liquid nozzle 15 is supplied with nitrogen gas and purified water (DIW) respectively from a nitrogen gas supply source and a purified water supply source. The nitrogen gas and purified water are mixed with each other inside the cleaning liquid nozzle 15. The purified water and nitrogen gas thus mixed generate a cleaning liquid comprising purified water mist (which will be referred to as "two-fluid cleaning liquid"), which is sprayed onto the surface of the wafer W.

The cleaning liquid nozzle 15 is supported by a first nozzle arm 51, which is movable up and down by a first arm elevating mechanism 56. The first arm elevating mechanism 56 is attached to a slider 61, which is movably fitted onto a guide 54 extending in the X-direction in the mechanism accommodation chamber. A first nozzle slide mechanism 66 is arranged to control the position of the slider 61 in the X-direction. For example, the first nozzle slide mechanism 66 may be formed of an electromagnetic linear motor or ball-screw mechanism. With this arrangement, the cleaning liquid nozzle 15 can be moved to scan the wafer W in the X-direction, and further can be retreated over the upper end of the cup 12 to be out of the cup 12.

The gas nozzle 16 for supplying nitrogen gas onto the surface of the wafer W is supported by a second nozzle arm 52, which is movable up and down by a second arm elevating mechanism 57. The second arm elevating mechanism 57 is attached to a slider 62, which is movably fitted onto the guide 54 extending in the X-direction in the mechanism accommodation chamber. A second nozzle slide mechanism 67 is arranged to control the position of the slider 62 in the X-direction. The second nozzle slide mechanism 67 is preferably formed of a drive system of the same type as that of the first nozzle slide mechanism 66. With this arrangement, the gas nozzle 16 also can be moved to scan the wafer W in the X-direction, and further can be retreated over the upper end of the cup 12 to be out of the cup 12.

For the cleaning apparatus 10 arranged as described above, a control section (process controller) 80 administrates drive control of various mechanisms disposed therein, and valve control for supplying fluids, such as nitrogen gas and purified water, from supply sources to various nozzles. The control section 80 is connected to a data I/O section 81 including, e.g., a keyboard and a display, wherein the keyboard is used for a process operator to input commands for operating the cleaning apparatus 10, and the display is used for showing visualized images of the operational status of the cleaning apparatus 10.

Further, the control section 80 is connected to a memory section 82 that stores control programs for the control section 80 to control the cleaning apparatus 10 so as to perform various processes, and programs (i.e., recipes) for respective components of the cleaning apparatus 10 to perform processes in accordance with process conditions. Recipes may be stored in a hard disk or semiconductor memory, or stored in a portable storage medium, which is computer readable, such as a CD-ROM or DVD-ROM, to be attached to a predetermined position in the memory section 82.

A required recipe is retrieved from the memory section 82 and executed by the control section 80 in accordance with an instruction or the like input through the data I/O section 81. Consequently, the cleaning apparatus 10 can perform a predetermined process under the control of the control section 80.

Figure 4:
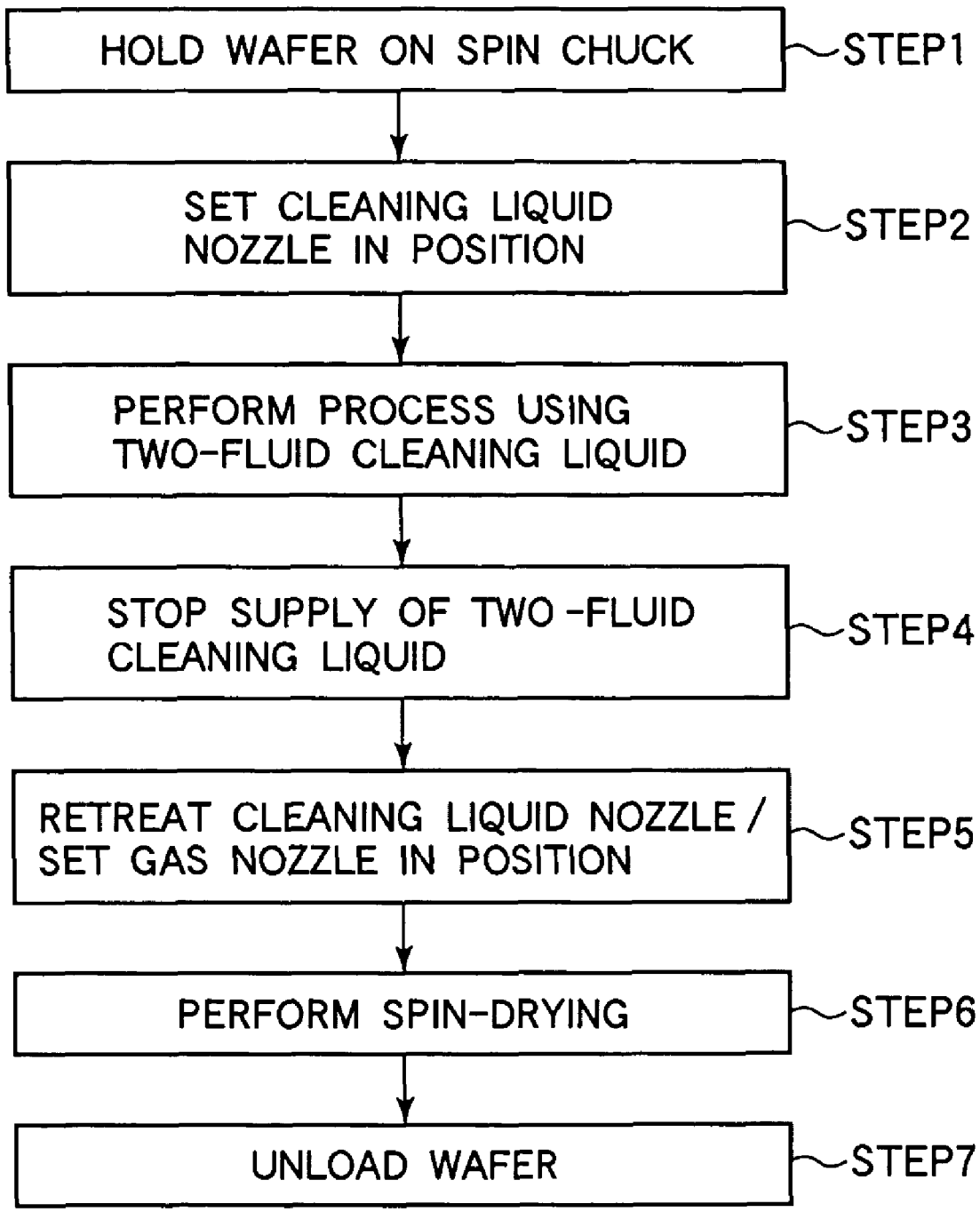
[FIG. 4] This is a flowchart showing steps of a wafer process performed by the cleaning apparatus shown in FIG. 1.

Next, an explanation will be given of steps for processing a wafer W in the cleaning apparatus 10 arranged as described above, with reference to the flowchart shown in FIG. 4. At first, while the cup 12 is placed at the lower position, the plate member 76 is moved up by the elevating mechanism 77. Consequently, the holding members 75 are pushed by the pushing jigs 78, and the outer peripheral ends of the holding members 75 are thereby moved outward and downward. In this state, the shutter 92 is opened, and the window portion 91 is thereby opened. Then, a wafer transfer arm (not shown) that holds a wafer W is inserted into the housing 90 through the window portion 91, and the wafer W is transferred onto the chuck plate 71. After the wafer transfer arm is retreated from the housing 90, the plate member 76 is moved down. Consequently, the pushing jigs 78 are separated from the holding members 75, and the holding members 75 thereby hold the wafer W (Step 1). Thereafter, the cup 12 is moved to the upper position.

Then, the cleaning liquid nozzle 15 is moved from the retreat position outside the cup 12 (i.e., the position shown in FIG. 1) to a position at a predetermined height above the center of the wafer W held by the spin chuck 11 (Step 2).

Subsequently, while the wafer W is rotated at a predetermined speed, and the cleaning liquid nozzle 15 is moved for scanning in the X-direction, the two-fluid cleaning liquid is sprayed from the cleaning liquid nozzle 15 toward the surface of the wafer W for a predetermined time to clean the surface of the wafer W (Step 3). A scanning pattern of the cleaning liquid nozzle 15 used at this time may be a pattern of scanning the wafer W between the ends thereof in the X-direction, or a pattern of scanning the wafer W between the center and one end thereof.

In the process using the two-fluid cleaning liquid on the wafer W, the following manner is preferably used to equalize the processing time per unit area over the wafer W. Specifically, the traveling speed of the supply point of the two-fluid cleaning liquid (i.e., the scanning speed of the cleaning liquid nozzle 15) is set to be higher at the central portion of the wafer W than at the peripheral portion. Alternatively, while the scanning speed of the cleaning liquid nozzle 15 is set to be constant, the rotation number of the wafer W is set to be higher for the cleaning liquid nozzle 15 being present at the central portion of the wafer W than at the peripheral portion.

After a predetermined time has elapsed, supply of the two-fluid cleaning liquid is preferably finished at the edge of the wafer W near the retreat position of the cleaning liquid nozzle 15. It is preferable that a purified water film remains on the surface of the wafer W after supply of the two-fluid cleaning liquid is stopped (Step 4). Thereafter, the cleaning liquid nozzle 15 is retreated out of the cup 12, and the gas nozzle 16 is moved to a position above the center of the wafer W (Step 5). Subsequently, while the wafer W is rotated at a higher speed than that used in supplying the two-fluid cleaning liquid (Step 3), and nitrogen gas is sprayed from the gas nozzle 16 toward the wafer W, the gas nozzle 16 is moved for scanning from the center of the wafer W to the peripheral edge of the wafer W to dry the surface of the wafer W (Step 6). The gas nozzle 16 is preferably moved for scanning toward the retreat position of the gas nozzle 16.

After this spin-drying is finished, the gas nozzle 16 is retreated out of the cup 12. Thereafter, the wafer W is unloaded from the housing 90 in procedures reverse to those used when the wafer W is loaded into the housing 90 and placed on the chuck plate 71 (Step 7).

In relation to the cleaning method of the wafer W described above, FIG. 5A is a graph showing the relationship of static build-up voltage with the scanning speed of the cleaning liquid nozzle 15. FIG. 5B is a graph showing the relationship of static build-up voltage with the rotation number of the wafer W. For FIGS. 5A and 5B, the wafer W was prepared by forming an insulative film on the surface of a bare wafer.

Figure 5A:
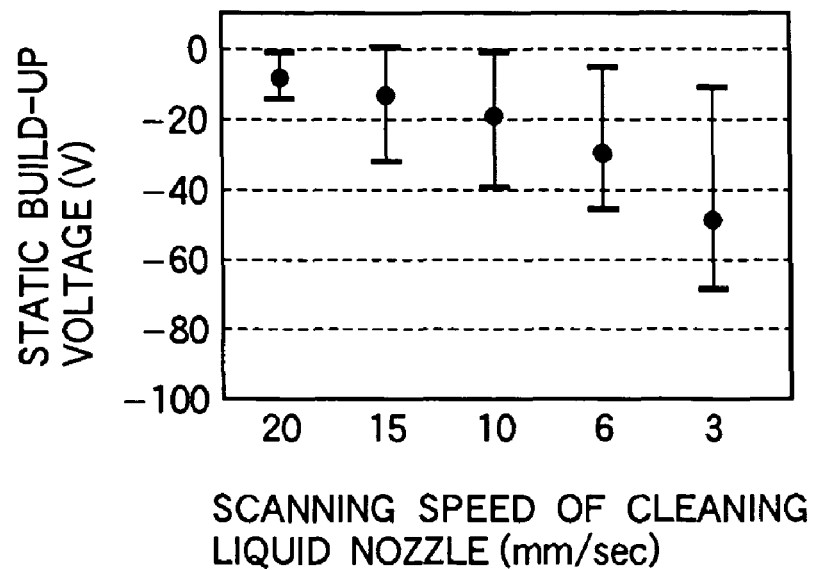
[FIG. 5A] This is a view showing the relationship of static build-up voltage with the scanning speed of a nozzle for delivering a cleaning liquid.
Figure 5B:
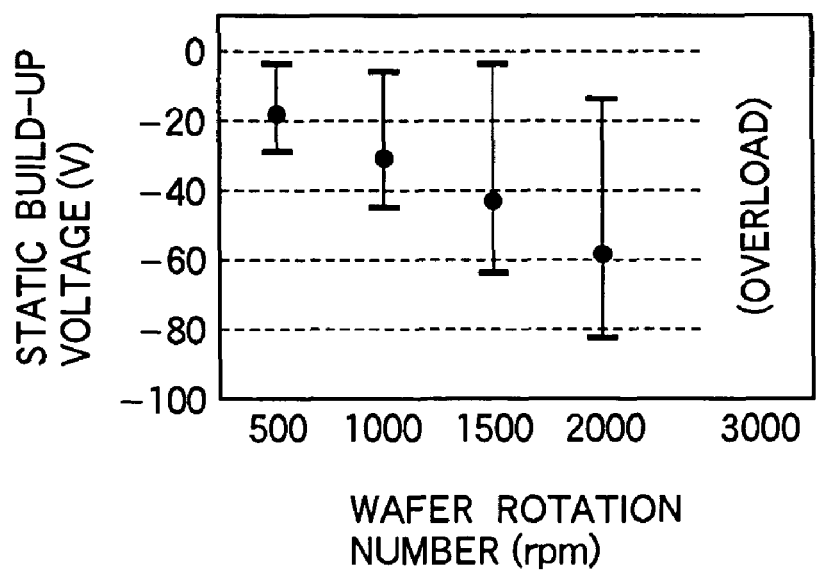
[FIG. 5B] This is a view showing the relationship of static build-up voltage with the rotation number of a wafer.

As shown in FIG. 5A, with a decrease in the scanning speed of the cleaning liquid nozzle 15, the absolute value of static build-up voltage becomes larger. From this result, the scanning speed of the cleaning liquid nozzle 15 is preferably set to be 15 mm/sec or more. As regards the upper limit, the scanning speed of the cleaning liquid nozzle 15 is preferably set to be 30 mm/sec or less, which can prevent the cleaning effect from being lowered.

As shown in FIG. 5B, with an in crease in the rotation number of the wafer W during the two-fluid cleaning, the absolute value of static build-up voltage becomes larger. From this result, the rotation number of the wafer W is preferably set to be 1,000 rpm or less. As regards the lower limit, the rotation number of the wafer W is preferably set to be 300 rpm or more, because a decrease in the rotation number prolongs the processing time, thereby deteriorating the throughput of the cleaning apparatus 10. In light of the accuracy and processing time in cleaning the wafer W, the rotation number of the wafer W is preferably set to be 300 to 600 rpm.

In the explanation described above, the cleaning liquid is exemplified by a case where the two-fluid cleaning liquid is used. Alternatively, it is also possible to suppress static build-up on a wafer W by use of high pressure jet water or mega-sonic cleaning water in the cleaning method described above.

Figure 6:
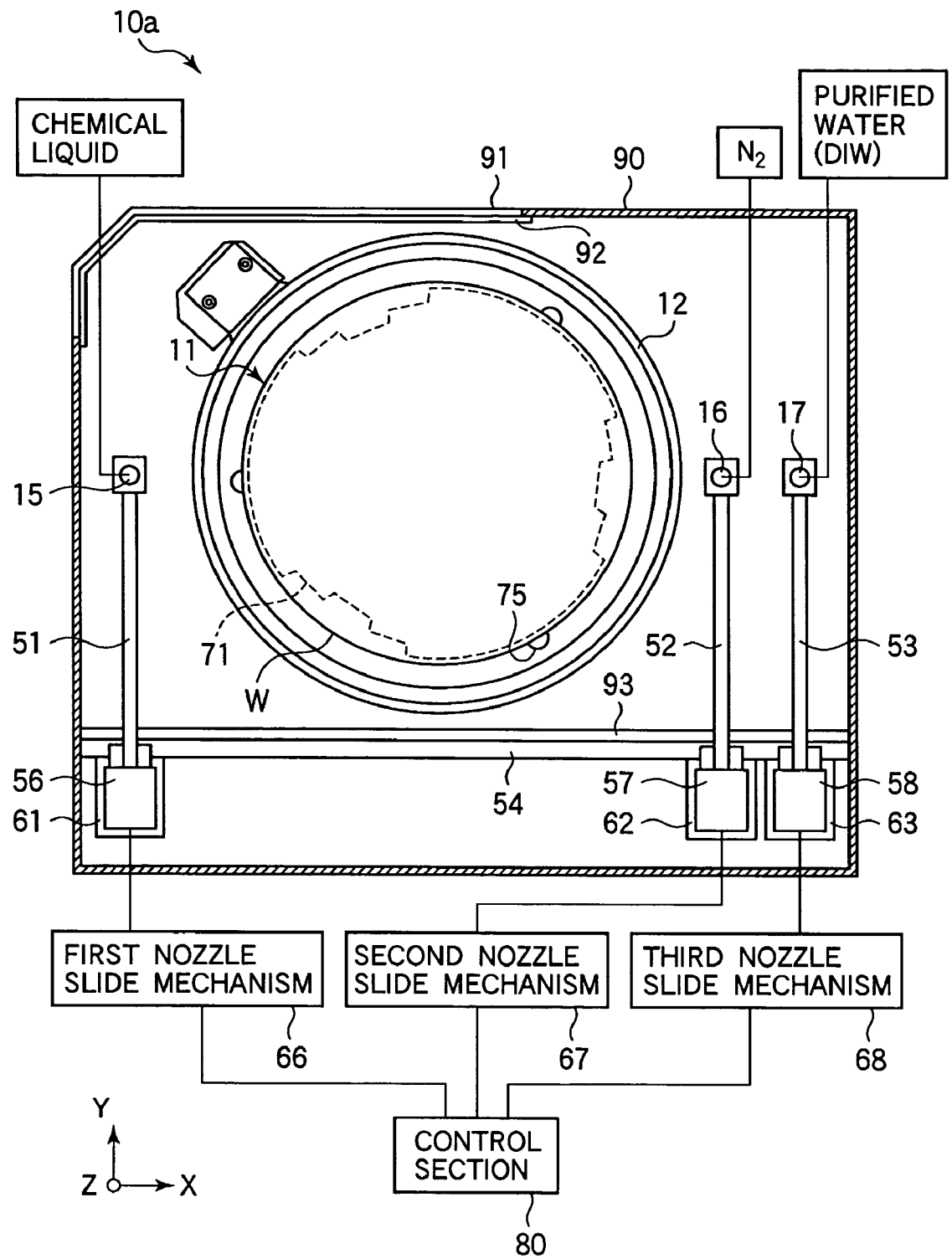
[FIG. 6] This is a plan view schematically showing the structure of another cleaning apparatus.

Next, an explanation will be give of a cleaning apparatus according to another embodiment. FIG. 6 is a plan view schematically showing a cleaning apparatus 10a. This cleaning apparatus 10a differs from the cleaning apparatus 10 shown in FIGS. 1 to 3, in that the apparatus 10a includes a cleaning liquid nozzle 15 arranged to supply onto a wafer W a chemical liquid for removing polymer and/or metal, and further includes a rinsing nozzle 17.

The rinsing nozzle 17 is arranged to supply purified water (DIW) used as a rinsing liquid onto the surface of the wafer W. The rinsing nozzle 17 is supported by a third nozzle arm 53, which is movable up and down by a third arm elevating mechanism 58. The third arm elevating mechanism 58 is attached to a slider 63, which is movably fitted onto the guide 54. A third nozzle slide mechanism 68 is arranged to move the slider 63 in the X-direction under the control of the control section 80. The third nozzle slide mechanism 68 is preferably formed of a drive system of the same type as that of the first nozzle slide mechanism 66. With this arrangement, the rinsing nozzle 17 also can be moved to scan the wafer W in the X-direction, and further can be retreated over the upper end of the cup 12 to be out of the cup 12.

The other components of the cleaning apparatus 10a are arranged to be the same as those of the cleaning apparatus 10, and thus their explanation will be omitted.

Figure 7:
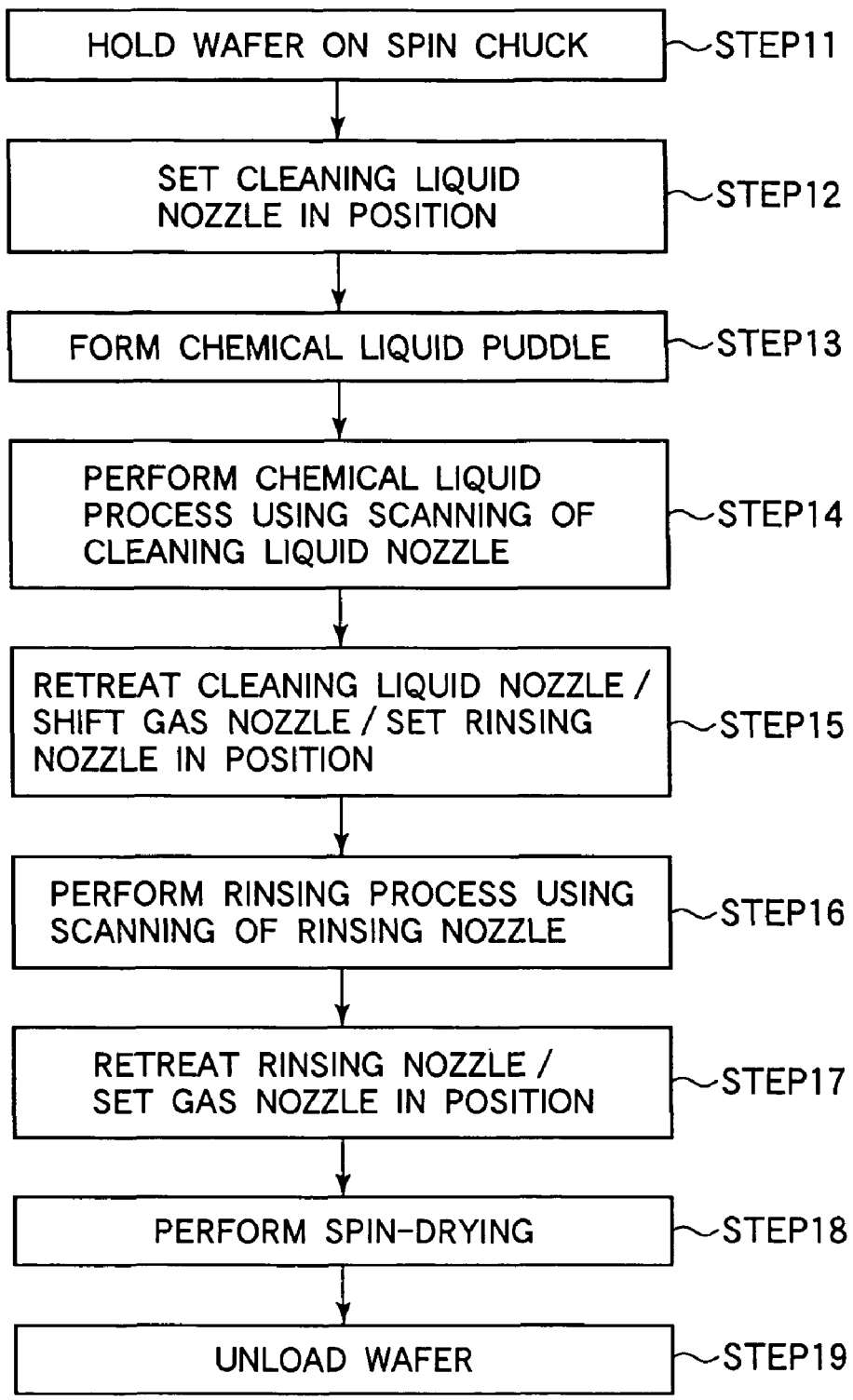
[FIG. 7] This is a flowchart showing steps of a wafer process performed by the cleaning apparatus shown in FIG. 6.

Next, an explanation will be given of steps for processing a wafer W in the cleaning apparatus 10a, with reference to the flowchart shown in FIG. 7. At first, as described with reference to the flowchart shown in FIG. 4, a wafer is held by the spin chuck 11 (Step 11). Then, the cleaning liquid nozzle 15 is moved from the retreat position outside the cup 12 to a position at a predetermined height above the center of the wafer W (Step 12). Then, while the wafer W is set in a stationary state, a predetermined chemical liquid is supplied onto the surface of the wafer W to form a chemical liquid puddle (Step 13). Then, after a predetermined time has elapsed, while the wafer W is rotated at a predetermined speed, and the cleaning liquid nozzle 15 is moved for scanning in the X-direction, the chemical liquid is further supplied onto the wafer W (Step 14).

After a predetermined time has elapsed, supply of the chemical liquid is stopped. Then, the cleaning liquid nozzle 15 is retreated out of the cup 12, and the rinsing nozzle 17 is moved to a position above the center of the wafer W (Step 15). At this time, the gas nozzle 16 is shifted toward the cleaning liquid nozzle 15 outside the cup 12. Then, while the wafer W is rotated, and purified water is delivered from the rinsing nozzle 17, the rinsing nozzle 17 is moved for scanning between the center of the wafer W and the peripheral edge thereof (Step 16). With this rinsing process, the chemical liquid on the surface of the wafer W is washed out.

Figure 8:
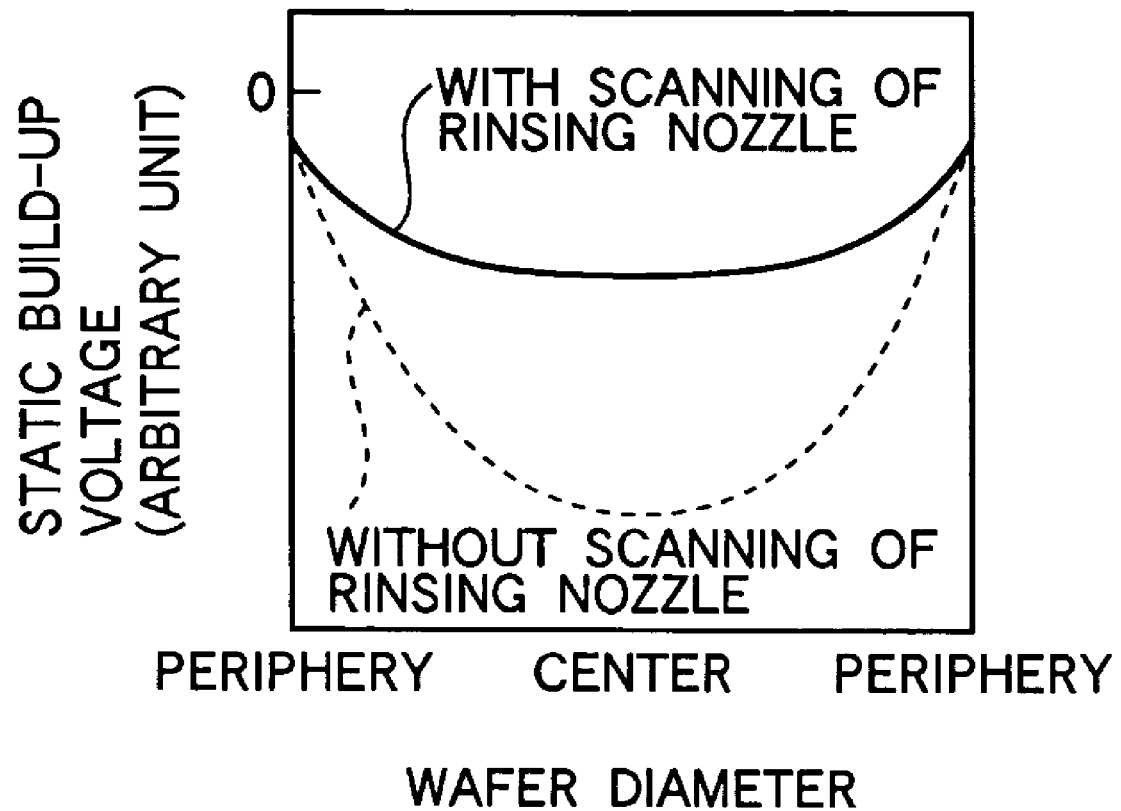
[FIG. 8] This is a view showing the relationship of static build-up voltage with a rinsing method.

FIG. 8 is an explanatory view showing the profile of static build-up voltage in a case where purified water is supplied only onto the center of the wafer W. In the rinsing process, where the supply point of purified water is not changed, the absolute value of static build-up voltage becomes larger at this position. On the other hand, where the rinsing nozzle 17 is moved for scanning, the absolute value of static build-up voltage becomes smaller at the wafer center.

In this rinsing process, the following manner is preferably used to equalize the processing time per unit area over the wafer W. Specifically, the traveling speed of the supply point of purified water, i.e., the scanning speed of the rinsing nozzle 17, is set to be higher at the central portion of the wafer W than at the peripheral portion. Alternatively, the rotation number of the wafer W is set to be higher for the rinsing nozzle 17 being present at the central portion of the wafer W than at the peripheral portion. Consequently, the absolute value of static build-up voltage becomes smaller and more uniform over the entire wafer W, so the wafer W is prevented from being damaged. Further, where the rinsing liquid is purified water with carbon dioxide gas dissolved therein to increase the electrical conductivity, the absolute value of static build-up voltage can be advantageously further smaller.

After a predetermined time has elapsed, the rinsing nozzle 17 is moved to a position above the peripheral edge of the wafer W near the retreat position of the rinsing nozzle 17, and supply of purified water is stopped. Then, the rinsing nozzle 17 is retreated out of the cup 12, and the gas nozzle 16 is moved to a position above the center of the wafer W (Step 17). It is preferable that a purified water film remains on the surface of the wafer W after supply of purified water from the rinsing nozzle 17 is stopped.

Then, while the wafer W is rotated at a higher speed than that used in supplying purified water (the process in Step 16), and nitrogen gas is sprayed from the gas nozzle 16 toward the wafer W, the gas nozzle 16 is moved for scanning from the center of the wafer W to the peripheral edge of the wafer W (Step 18). Consequently, the surface of the wafer W is subjected to drying. The gas nozzle 16 is preferably moved for scanning toward the retreat position of the gas nozzle 16. After this spin-drying is finished, the gas nozzle 16 is retreated out of the cup 12. Thereafter, the wafer W is unloaded from the housing 90 (Step 19).

Figure 9A:
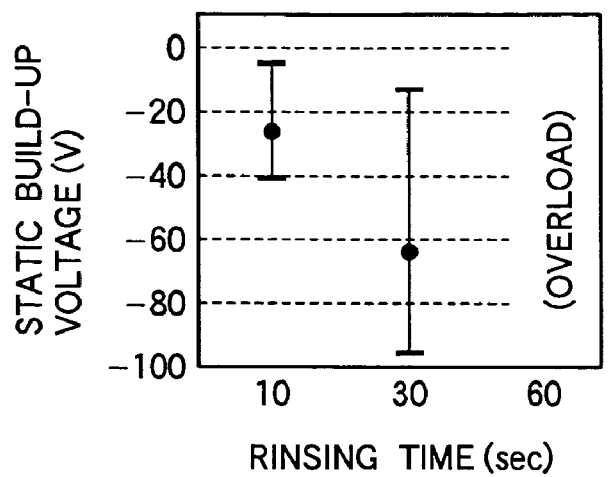
[FIG. 9A] This is a view showing the relationship of static build-up voltage with the processing time of a rinsing process.
Figure 9B:
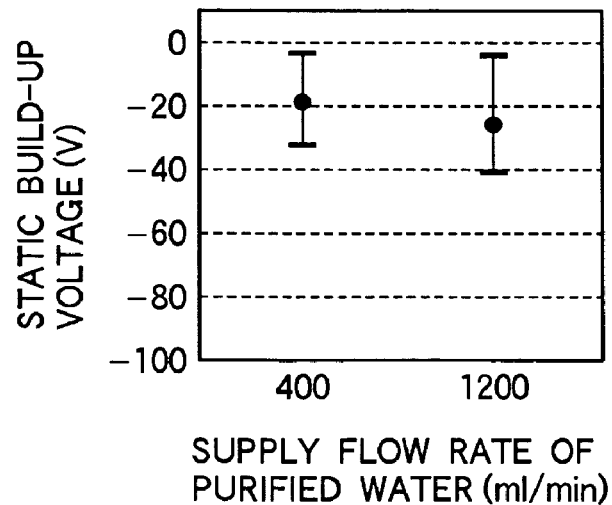
[FIG. 9B] This is a view showing the relationship of static build-up voltage with the rinsing time of a rinsing process.
Figure 9C:
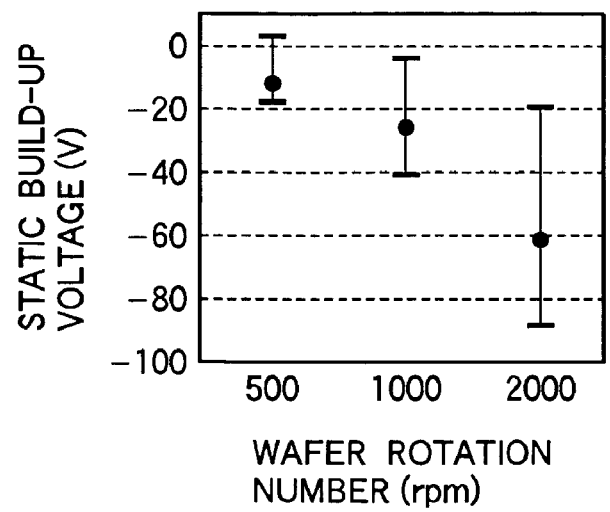
[FIG. 9C] This is a view showing the relationship of static build-up voltage with the rotation number of a wafer in a rinsing process.
Figure 10:
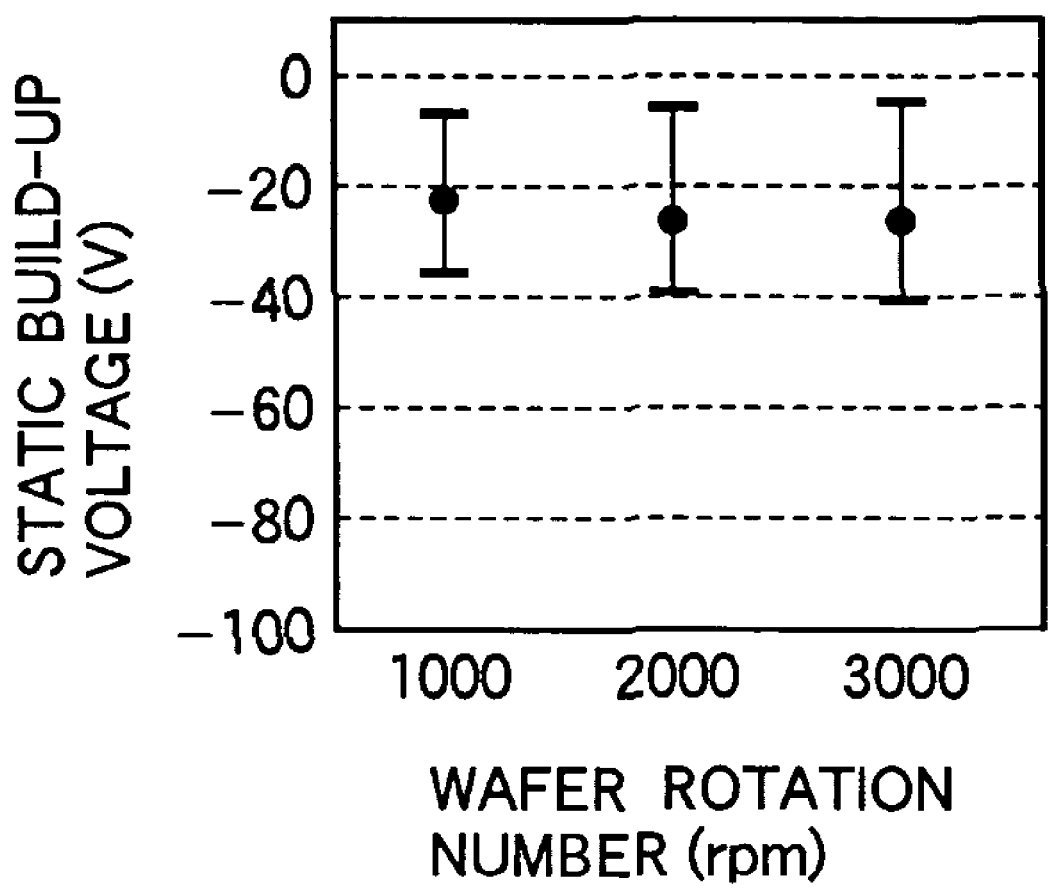
[FIG. 10] This is a view showing the relationship of static build-up voltage with spin-drying conditions.

FIGS. 9A to 9C are graphs showing the relationship of static build-up voltage with the rinsing conditions of this method using the chemical liquid cleaning, rinsing process, and spin-drying process to clean a wafer W. FIG. 10 is a view showing the relationship of static build-up voltage with the rotation number of the wafer W in the spin-drying. Specifically, FIG. 9A shows the relationship of static build-up voltage with the rinsing time. FIG. 9B shows the relationship of static build-up voltage with the rinsing liquid flow rate. FIG. 9C shows the relationship of static build-up voltage with the wafer rotation number. In order to obtain conspicuous relationships between the rinsing process conditions and static build-up, the chemical liquid cleaning was performed without scanning of the cleaning liquid nozzle 15 but only with formation of the puddle. Further, the spin-drying conditions were set to have constant values of 3,000 rpm and 20 seconds, because the spin-drying conditions only have small influences on the static build-up voltage, as described later in detail with reference to FIG. 10. The wafer W that rendered the results shown in FIGS. 9A to 9C had the same arrangement as that of the wafer W that rendered the results shown in FIGS. 5A and 5B.

As shown in FIG. 9A, with an increase in the rinsing time, the absolute value of static build-up voltage becomes larger. The rinsing time cannot be specifically determined because it depends on the type of the chemical liquid and properties thereof, such as viscosity, but the rinsing time is preferably set to be as short as possible within a range that does not allow the chemical liquid to remain on the wafer W. As shown in FIG. 9B, with a decrease in the supply flow rate of purified water, the absolute value of static build-up voltage becomes smaller. As shown in FIG. 9C, with a decrease in the rotation number of the wafer W, the absolute value of static build-up voltage becomes smaller. The rotation number during the rinsing process is preferably set to be 1,000 rpm or less. On the other hand, the rotation number of the wafer W during the rinsing process is preferably set to be 500 rpm or more, in light of the processing uniformity and processing time on the surface of the wafer W.

As shown in FIG. 10, the rotation number of the wafer W during the spin-drying only has a small influence on the value of static build-up voltage. This is thought to be due to the effect that the value of static build-up voltage on the wafer W has been substantially determined by the rinsing process.

The present invention has been described with reference to the embodiments, but the present invention is not limited to these embodiments. For example, a semiconductor wafer is treated as a substrate, but it is not limiting. The present invention may be applied to a glass substrate used for a flat panel display (FPD) and so forth.

The present invention does not exclude a scan rinsing process to be performed after the process using the two-fluid cleaning liquid or the like. For example, where a recipe is arranged to perform the process using the two-fluid cleaning liquid or the like for a short time, contaminants raised on a wafer W by the two-fluid cleaning liquid or the like may still remain on the wafer W when supply of the two-fluid cleaning liquid or the like is stopped. Accordingly, a scan rinsing process is performed preferably for a short time thereafter, so that the contaminants can be reliably removed.

The supply point of the two-fluid cleaning liquid or purified water is not necessarily arranged to trace a straight line. In this respect, the cleaning liquid nozzle or rinsing nozzle may be arranged to be rotatable, so that it can be moved to describe an arc through the center of a wafer W above the wafer W while supplying the two-fluid cleaning liquid or the like onto the wafer W. Further, the manner described above as a spin-drying process for a wafer W is arranged to rotate the wafer W while supplying nitrogen gas onto the wafer W. Alternatively, a wafer W may be merely rotated at a predetermined rotation number to dry the wafer W, without supplying nitrogen gas.

The embodiments described above are intended only to clarify the technical content of the present invention, and, therefore, the present invention should not be construed as being limited to the embodiments. Various modifications may be made without departing from the spirit of the present invention or the scope of the appended claims.

Industrial Applicability

The present invention is preferably applied to a cleaning process for a substrate, such as a semiconductor wafer.

The invention claimed is:

1. A substrate cleaning method comprising:
performing a two-fluid cleaning liquid process of cleaning a substrate supported on a support member, by supplying a two-fluid cleaning liquid, which has been prepared by changing purified water into mist by an inactive gas, onto a substrate, while rotating the substrate in an essentially horizontal state at a first rotation number, and moving a supply point of the two-fluid cleaning liquid onto the substrate to travel at a speed of 15 to 30 mm/sec in a radial direction of the substrate;
finishing the two-fluid cleaning liquid process by stopping supply of the two-fluid cleaning liquid while leaving a liquid film of the two-fluid cleaning liquid on the substrate;
then drying the substrate kept supported on the support member, by rotating the substrate with the liquid film present thereon at a second rotation number higher than the first rotation number, without supplying the two-fluid cleaning liquid onto the substrate; and then unloading the substrate from the support member, wherein said drying the substrate and said unloading the substrate are continuously performed in this order directly following said finishing the two-fluid cleaning liquid process and wherein the first rotation number is set to be 300 to 600 rpm.

2. The substrate cleaning method according to claim 1, wherein said drying the substrate further includes applying a spray of nitrogen gas to the substrate while causing the spray to travel from a center of the substrate to a peripheral edge thereof.

3. A computer readable non-transitory storage medium that stores a software for a computer to execute a control program, wherein the control program, when executed, controls a cleaning apparatus to perform a substrate cleaning method comprising:

performing a two-fluid cleaning liquid process of cleaning a substrate supported on a support member, by supplying a two-fluid cleaning liquid, which has been prepared by changing purified water into mist by an inactive gas, onto a substrate, while rotating the substrate in an essentially horizontal state at a first rotation number, and moving a supply point of the two-fluid cleaning liquid onto the substrate to travel at a speed of 15 to 30 mm/sec in a radial direction of the substrate;

finishing the two-fluid cleaning liquid process by stopping supply of the two-fluid cleaning liquid while leaving a liquid film of the two-fluid cleaning liquid on the substrate;

then drying the substrate kept supported on the support member, by rotating the substrate with the liquid film present thereon at a second rotation number higher than the first rotation number, without supplying the two-fluid cleaning liquid onto the substrate; and then unloading the substrate from the support member, wherein said drying the substrate and said unloading the substrate are continuously performed in this order directly following said finishing the two-fluid cleaning liquid process and wherein the first rotation number is set to be 300 to 600 rpm.

4. The storage medium according to claim 3, wherein said drying the substrate further includes applying a spray of nitrogen gas to the substrate while causing the spray to travel from a center of the substrate to a peripheral edge thereof.

5. A substrate cleaning method that continuously performs, in a following order, the steps of:

loading a substrate onto a support member such that the substrate is in an essentially horizontal state;

then cleaning the substrate by supplying a two-fluid cleaning liquid, which has been prepared by changing purified water into mist by an inactive gas, onto the substrate, while rotating the substrate by the support member at a first rotation number, and moving a supply point of the two-fluid cleaning liquid onto the substrate to travel at a speed of 15 to 30 mm/sec in a radial direction of the substrate;

finishing said cleaning by stopping supply of the two-fluid cleaning liquid while leaving a liquid film of the two-fluid cleaning liquid on the substrate;

then drying the substrate by rotating the substrate with the liquid film present thereon by the support member at a second rotation number higher than the first rotation number, without supplying the two-fluid cleaning liquid onto the substrate; and then unloading the substrate from the support member and wherein the first rotation number is set to be 300 to 600 rpm.

6. The substrate cleaning method according to claim 5, wherein said drying the substrate further includes applying a spray of nitrogen gas to the substrate while causing the spray to travel from a center of the substrate to a peripheral edge thereof.

7. The substrate cleaning method according to claim 5, wherein said two-fluid cleaning liquid process includes supplying the two-fluid cleaning liquid from a first nozzle that defines the supply point, while moving the first nozzle to scan over the substrate.

8. The substrate cleaning method according to claim 7, wherein said drying the substrate includes supplying an inactive gas from a second nozzle, while moving the second nozzle to scan over the substrate.

* * * * *